US011063083B2

(12) United States Patent
Chen et al.

(10) Patent No.: US 11,063,083 B2
(45) Date of Patent: Jul. 13, 2021

(54) LIGHT-SHIELDED CAMERAS AND METHODS OF MANUFACTURE

(71) Applicant: OmniVision Technologies, Inc., Santa Clara, CA (US)

(72) Inventors: Teng-Sheng Chen, Hsinchu (TW); Wei-Ping Chen, New Taipei (TW); Ying Chung, Taichung (TW); Chen-Yu Hung, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/600,180

(22) Filed: Oct. 11, 2019

(65) Prior Publication Data

US 2021/0111220 A1 Apr. 15, 2021

(51) Int. Cl.
*H01L 31/0232* (2014.01)
*H01L 27/146* (2006.01)

(52) U.S. Cl.
CPC .. *H01L 27/14685* (2013.01); *H01L 27/14623* (2013.01); *H01L 27/14636* (2013.01); *H01L 27/14687* (2013.01)

(58) Field of Classification Search
USPC ........................................................ 257/432
See application file for complete search history.

(56) References Cited

U.S. PATENT DOCUMENTS

| 7,679,167 | B2 | 3/2010 | Chen et al. | |
|---|---|---|---|---|
| 7,994,598 | B2* | 8/2011 | Weng | H01L 27/14623 257/432 |
| 8,351,219 | B2 | 1/2013 | Lin et al. | |
| 8,422,136 | B2 | 4/2013 | Hasegawa | |
| 2011/0086461 | A1* | 4/2011 | Bolis | H01L 27/14696 438/65 |
| 2013/0083229 | A1 | 4/2013 | Lin et al. | |
| 2016/0116653 | A1* | 4/2016 | Murayama | H01L 27/14618 359/359 |

* cited by examiner

*Primary Examiner* — Niki H Ngyuen
(74) *Attorney, Agent, or Firm* — Lathrop GPM LLP (57) ABSTRACT

A method for manufacturing light-shielded cameras includes forming a plurality of camera dies by dicing a camera wafer stack including (a) an image sensor wafer having a plurality of image sensors, (b) a cover glass bonded to the image sensor wafer, and (c) a lens wafer bonded to the cover glass and having a plurality of lenses, to form a plurality of camera dies. The method further includes, prior to the step of dicing, (i) from a first side of the image sensor wafer facing away from the cover glass and at least partly covered by an opaque layer, pre-cutting a sensor-cover wafer stack that includes the image sensor wafer and the cover glass, and (ii) depositing an opaque material in the pre-cuts. The method also includes, after the step of dicing, applying an opaque coating to second-side surfaces, of the camera dies, formed by the step of dicing.

20 Claims, 7 Drawing Sheets

LIGHT-SHIELDED CAMERAS AND METHODS OF MANUFACTURE

BACKGROUND

Wafer-level complementary metal-oxide-semiconductor (CMOS) manufacturing has allowed for manufacture of very low-cost image sensors. For additional cost benefits, wafer-level CMOS manufacturing has been extended to include wafer-level assembly of image sensors with lenses to form wafer stacks including a sensor wafer and a lens wafer. Lenses of the lens wafer are registered to image sensors of the sensor wafer, such that dicing of the wafer stack produces cameras. In addition to benefitting from low manufacturing cost, such cameras may be made extremely small and are thus suitable for implementation in compact devices. For example, chip-scale packaged (CSP) cameras are routinely used in consumer electronics products such as cellular phones. CSP cameras are also used in medical devices. For example, very small CSP cameras are uniquely suited for use in medical endoscopes where space constraints are particularly challenging. In a medical endoscope, a CSP camera may be integrated with a light source, such as one or more small light-emitting diodes, for illuminating the scene to be imaged by the CSP camera.

Most cameras utilize a form of light baffle to prevent light from entering the camera and being detected by the image sensor without having been properly imaged by the lens. For example, a CSP camera may be covered by a light-proof case that limits light entry to an aperture directly in front of the lens. In the absence of a light baffle, image contrast may be degraded by light entering the camera through a side of the lens or a side of the cover glass.

SUMMARY

In an embodiment, a method for manufacturing light-shielded cameras includes forming a plurality of camera dies by dicing a camera wafer stack including (a) an image sensor wafer having a plurality of image sensors, (b) a cover glass bonded to the image sensor wafer, and (c) a lens wafer bonded to the cover glass and having a plurality of lenses. Each camera die includes one of the image sensors, a portion of the cover glass, and one of the lenses. The method further includes, prior to the step of dicing, (i) from a first side of the image sensor wafer facing away from the cover glass and at least partly covered by an opaque layer, pre-cutting a sensor-cover wafer stack that includes the image sensor wafer and the cover glass, to form pre-cuts for said dicing, and (ii) depositing an opaque material in the pre-cuts. The method also includes, after the step of dicing, applying an opaque coating to second-side surfaces of the camera dies, wherein the second-side surfaces are formed by the step of dicing.

In an embodiment, a light-shielded camera includes (a) an image sensor having opposite-facing first and second sides, wherein the first side includes a plurality of solder balls and opaque material disposed on portions of the first side not occupied by the solder balls, (b) a cover glass bonded to the second side, and (c) a lens bonded to the cover glass. The light-shielded camera forms four sidewalls parallel to an optical axis of the light-shielded camera. Each of the four sidewalls are coated by an opaque coating and includes a planar portion cooperatively formed by the image sensor, the cover glass, and the lens.

BRIEF DESCRIPTION OF THE DRAWINGS

FIGS. 6-11 are diagrams illustrating examples of steps of the method of FIG. 5, wherein FIG. 11 shows one embodiment of a light-shielded camera produced by the method of FIG. 5.

FIGS. 13-16 are diagrams illustrating examples of steps of the method of FIG. 12, wherein FIG. 16 shows one embodiment of a light-shielded camera produced via the method of FIG. 12.

DESCRIPTION OF EXAMPLE EMBODIMENTS

Figure 1:
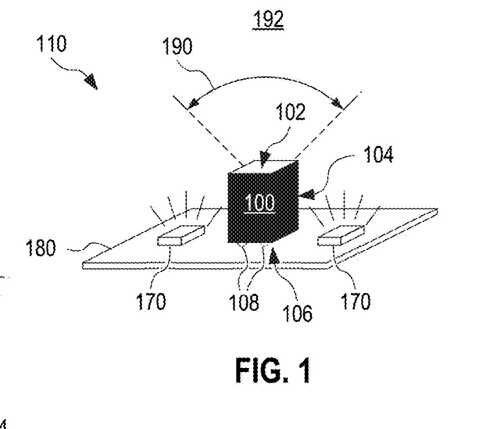
FIG. 1 illustrates a light-shielded camera in an example scenario, according to an embodiment.

FIG. 1 illustrates one light-shielded camera 100 in an example scenario. Light-shielded camera 100 may be a chip-scale camera and is depicted, in FIG. 1, as implemented in an imaging device 110. Imaging device 110 further includes one or more light sources 170, and a substrate 180 supporting light source(s) 170 and camera 100. Each light source 170 may include one or more light-emitting diodes. In operation, light source(s) 170 illuminate scene 192 while camera 100 captures images of scene 192. Imaging device 110 may be a medical imaging device such as an endoscope camera.

Camera 100 has a light-receiving surface 102, through which camera 100 collects light from a field of view 190 to image a scene 192. Camera 100 has a backside 106 and side walls 104. Backside 106 faces away from light-receiving surface 102. Side walls 104 span between light-receiving surface 102 and backside 106. Backside 106 includes a plurality of solder balls 108. Without departing from the scope hereof, backside 106 may include more than two solder balls 108. Side walls 104 are opaque so as to shield camera 100 from light entry through side walls 104. In the scenario depicted in FIG. 1, light source(s) 170 are likely to strongly illuminate side walls 104. Thus, if side walls 104 were not opaque, a large amount of light would be expected to enter camera 100 through side walls 104 and significantly degrade the contrast in images captured by camera 100. Backside 106 is opaque as well, so as to shield camera 100 from light entry through backside 106. In the scenario depicted in FIG. 1, solder balls 108 are soldered to substrate 180, but a gap may exist between substrate 180 and parts of backside 106 not occupied by solder balls 108. Light from light source(s) 170 may enter this gap and, if backside 106 was not opaque, enter camera 100 through parts of backside 106 no occupied by solder balls 108.

Camera 100 may be employed in other scenarios than that depicted in FIG. 1. For example, camera 100 may be implemented in an imaging device that does not include any light sources. In such implementations, the scene may be illuminated by ambient light, such as room light or natural light, and the light shielding provided by side walls 104 and backside 106 being opaque may prevent, or at least reduce, ambient light entry into camera 100 through side walls 104 and backside 106.

Herein, an "opaque" material or object refers to the material or object being either fully light-blocking or light-attenuating. For example, opaque materials and objects discussed herein may attenuate light transmission therethrough by at least 90%, 99%, 99.9%, or 99.99%. Opaque materials and objects disclosed herein are, for example, black or reflective.

Figure 2:
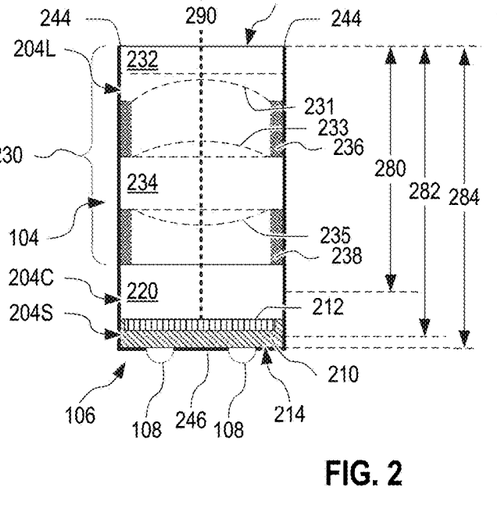
FIG. 2 is a more detailed cross-sectional view of the camera of FIG. 1.

FIG. 2 is a more detailed cross-sectional view of camera 100, with the cross section containing an optical axis 290 of camera 100. Camera 100 includes an image sensor 210, a cover glass 220, and a lens 230. Lens 230 images a scene, such as scene 192, onto image sensor 210 through cover glass 220. In an embodiment, cover glass 220 is bonded to image sensor 210, and lens 230 is bonded to cover glass 220. Cross sectional dimensions 286, orthogonal to optical axis 290, may be in the range between 0.5 and 10 millimeters, or in the range between 0.5 and 2.0 millimeters.

Image sensor 210 includes a pixel array 212 of photosensitive pixels, and solder balls 108. Solder balls 108 are electrically connected to pixel array 212 via connections not shown in FIG. 2. Image sensor 210 may be a complementary metal-oxide-semiconductor (CMOS) image sensor. Image sensor 210 forms a surface 214 that faces away from cover glass 220. Surface 214 is, for example, a surface of a silicon substrate of image sensor 210, optionally including metal electrodes and/or metal traces. Solder balls 108 are formed on surface 214. Backside 106 further includes an opaque layer 246 that covers parts of surface 214 not occupied by solder balls 108. In one embodiment, opaque layer 246 is black solder mask that, together with solder balls 108, covers the entire backside 106 of camera 100. It is understood that, in some embodiments, solder balls 108 are positioned such that no solder balls 108 are in the same cross section as optical axis 290.

Although not depicted in FIG. 1, image sensor 210 may include one or both of (a) a color-filter array above pixel array 212 and (b) a microlens array above pixel array 212 or above the color-filter array. A gap may exist between cover glass 220 and some portions of image sensor 210. For example, a peripheral portion of image sensor 210, surrounding optical axis 290, may extend all the way to cover glass 220, while a central portion of image sensor 210, associated with pixel array 212, is spaced apart from cover glass 220 and includes a color-filter array and a microlens array.

Image sensor 210 has side walls 204S spanning from backside 106 to cover glass 220. Side walls 204S surround optical axis 290. Cover glass 220 has side walls 204C spanning from image sensor 210 to lens 230. Side walls 204C surround optical axis 290. Lens 230 has side walls 204L spanning from cover glass 220 to light-receiving surface 102. Side walls 204L surround optical axis 290. Each side wall 104 consists of a side wall 204S, a side wall 204C, and a side wall 204L. Side walls 104 are covered by an opaque coating 244. Opaque coating 244 may be black paint.

Opaque layer 246 and opaque coating 244 prevents light from entering camera 100 from other directions than through light-receiving surface 102, or, alternatively, significantly reduces light entry from other directions than through light-receiving surface 102.

Figure 3:
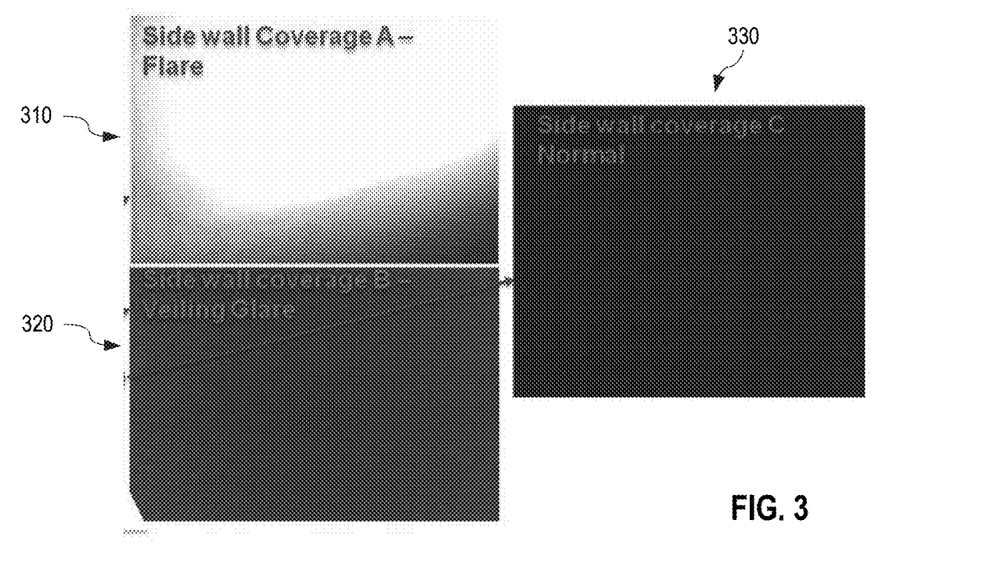
FIG. 3 shows example images captured with varying degrees of light shielding.

FIG. 3 shows an example image 330 captured by an embodiment of camera 100, as implemented in imaging device 110, when scene 192 is black. In the embodiment of camera 100, used to capture image 330, image sensor 210 is a CMOS image sensor. For comparison, FIG. 3 also shows example images 310 and 320 captured by modified versions of camera 100 having less light shielding. Image 310 is captured with a modified version of camera 100 that omits opaque layer 246, and wherein opaque coating 244 extends only the range 280 shown in FIG. 2. Range 280 is less than the full height 284 of side walls 104 and extends from light-receiving surface 102 only to approximately the mid-line of cover glass 220. Thus, image 310 is captured under conditions that allow light to enter camera 100 through part of side wall 204C, through all of side wall 204S, and through portions of backside 106 not occupied by solder balls 108. Image 320 is captured with a modified version of camera 100 that omits opaque layer 246, and wherein opaque coating 244 extends the range 282 of side walls 104. Range 282 is also less than full height 284 and extends from light-receiving surface 102 to approximately the mid-line of the silicon substrate of the present embodiment of image sensor 210. Thus, image 320 is captured under conditions that allow light to enter camera 100 through part of side wall 204S, and through portions of backside 106 not occupied by solder balls 108.

From a comparison of images 310, 320, and 330, it is evident that light-shielding of cover glass 220 is very important, as an overwhelming light flare is present in image 310. Image 320 represents a great improvement over image 310 but still shows increased background, as compared to image 330. Comparing images 320 and 330, it is evident that light transmitted through the silicon substrate of the present embodiment of camera 100 raises the background level. Image 330 is essentially black and demonstrates the light-shielding benefits of camera 100.

Although not shown in FIG. 2, camera 100 may include an opaque coating that forms an aperture on light-receiving surface 102, without departing from the scope hereof. For example, camera 100 may have a black layer on all of light-receiving surface 102 except for a circular aperture or rectangular aperture centered on optical axis 290. Such an aperture may prevent collection of light rays that would be able to pass through peripheral regions of lens 230, e.g., outside an actual lens surface, and reach image sensor 210 without being properly imaged by lens 230. In another example, lens 230 may form an internal aperture that prevents such light rays from reaching image sensor 210. This internal aperture may be at light-receiving surface 102 or deeper in lens 230 between light-receiving surface 102 and cover glass 220.

Each lens 230 may be a composite lens that includes multiple lens elements, one or more apertures, one or more spacers, and/or other optical components such as a filter. FIG. 2 shows one example, wherein lens 230 includes a lens element 232, a wafer-level lens having two lens elements 233 and 235 formed on opposite sides of a substrate 234, a spacer 236 between lens element 232 and substrate 234, and a spacer 238 between substrate 234 and cover glass 220.

Figure 4:
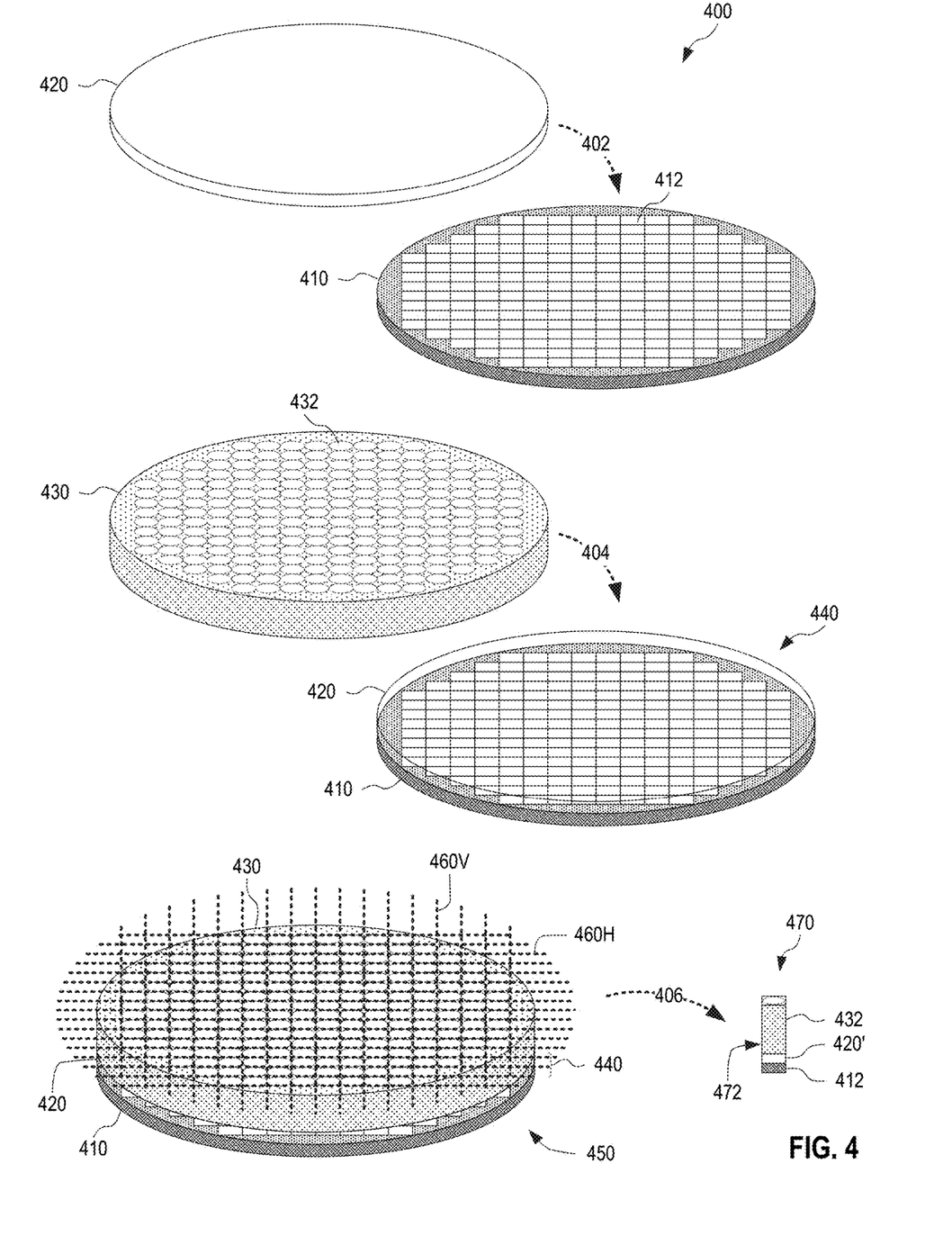
FIG. 4 illustrates a wafer-level-based method for assembling camera dies, according to an embodiment.

FIG. 4 illustrates one wafer-level-based method 400 for assembling camera dies 470. In a step 402, a cover glass 420 is bonded to an image sensor wafer 410 to produce a sensor-cover wafer stack 440. Image sensor wafer 410 includes an array of image sensor 412. Each image sensor 412 may be an instance of image sensor 210. Step 402 may include adhering cover glass 420 to image sensor wafer 410, such that a glue layer or other form of adhesive exists therebetween. In a step 404, a lens wafer 430 is bonded to sensor-cover wafer stack 440 to produce a camera wafer stack 450. Lens wafer 430 includes an array of lenses 432. When lens wafer 430 is bonded to sensor-cover wafer stack 440 in step 404, each lens 432 of lens wafer 430 is positioned above a corresponding image sensor 412. Step 404 may include adhering lens wafer 430 to cover glass 420, such that a glue layer or other form of adhesive exists therebetween. In a step 406, camera wafer stack 450 is diced to singulate therefrom a plurality of camera dies 470. Each camera die 470 includes an image sensor 412, a cover glass 420' (a portion of cover glass 420), and a lens 432.

The wafer-level assembly of steps 402 and 404 are cost-saving. However, it is not possible (at least very easily) to light-shield side walls 472 at the wafer-level, since side walls 472 are only formed in dicing step 406. Manual application of an opaque coating to side walls 472 of each camera die 470 is cumbersome and costly.

It is understood that image sensor wafer 410 may include a different number of image sensors 412 than depicted in FIG. 4, and that lens wafer 430 may include a different number of lenses 432 than depicted in FIG. 4. In one example, image sensor wafer 410 includes several hundred or several thousand image sensors 412, and lens wafer 430 includes several hundred or several thousand lenses 432.

Figure 5:
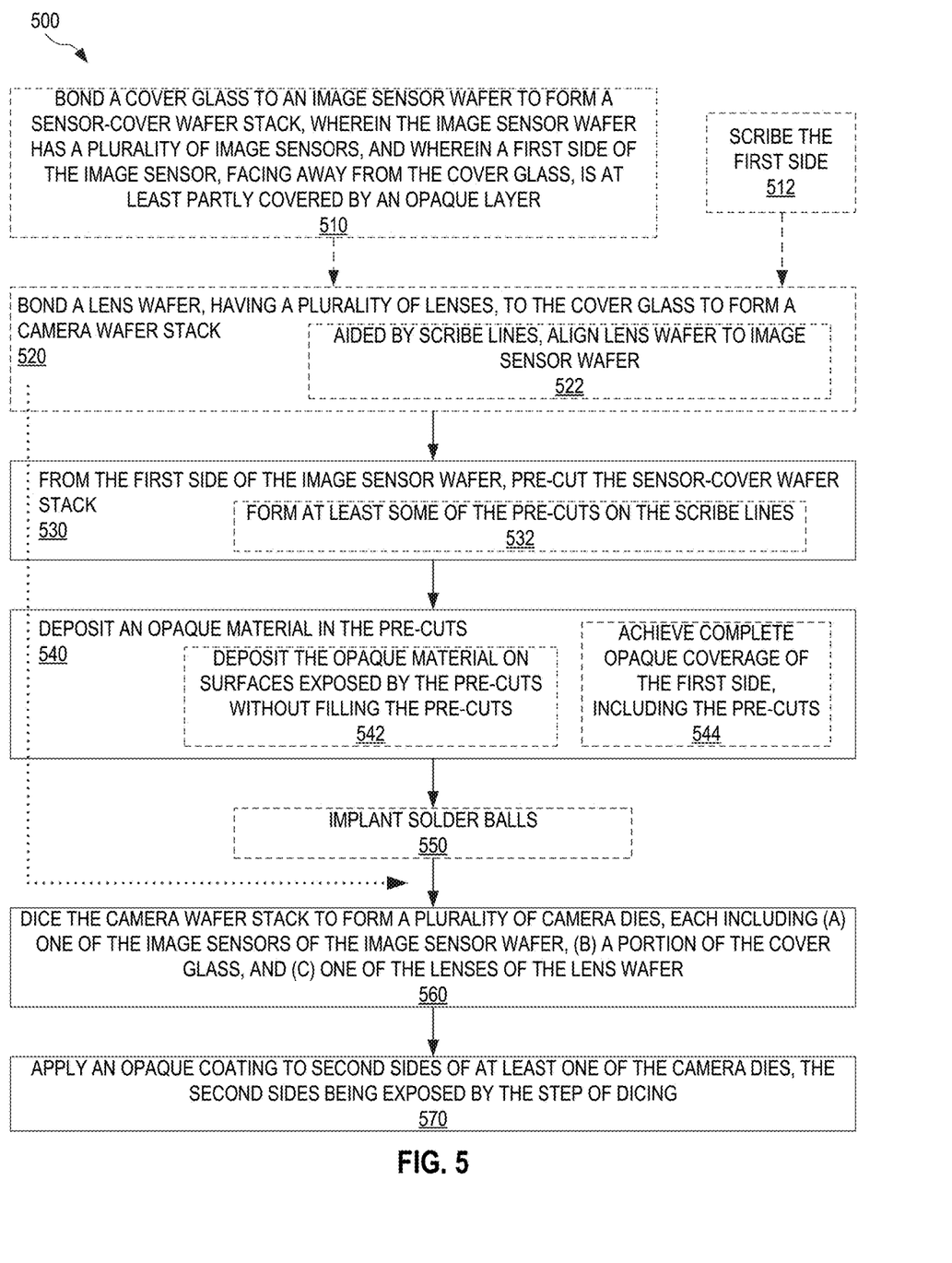
FIG. 5 is a flowchart for a method for manufacturing light-shielded cameras, according to an embodiment.

FIG. 5 is a flowchart for one method 500 for manufacturing light-shielded cameras. Method 500 is partly wafer-level based, and some stages of light-shielding are achieved at the wafer-level. Method 500 represents a modification and extension of method 400 to further include light-shielding. Method 500 includes steps 530, 540, 560, and 570.

Step 530 may be preceded by a step 510 and, optionally, also a step 520. Step 510 bonds a cover glass to an image sensor wafer to form a sensor-cover wafer stack. The image sensor wafer includes a plurality of image sensors. Step 510 is similar to step 402 of method 400. However, a first side of the image sensor wafer of step 510, facing away from the cover glass, is at least partly covered by an opaque layer. The first side of the image sensor wafer may further include a plurality of solder balls for each of the image sensors. Step 520 bonds a lens wafer to the cover glass to form a camera wafer stack. The lens wafer includes a plurality of lenses. Step 520 is similar to step 404 of method 400. The lens wafer may be a composite lens wafer that includes several layers (lens layers, spacers, etc.) such that each lens of the lens wafer is a composite lens that includes several different optical components as discussed above in reference to FIG. 2.

The input to step 530 is either a sensor-cover wafer stack such as that produced by step 510, or a camera wafer stack such as that produced by steps 510 and 520 in cooperation. In embodiments of method 500 where step 530 is not preceded by either one of steps 510 and 520, the input to step 530 is either (a) a sensor-cover wafer stack such as that produced by step 510 but provided by a third party, or (b) a camera stack such as that produced by steps 510 and 520 but provided by a third party. In embodiments of method 500 where step 530 is preceded by step 510 but not by step 520, the input to step 530 is the sensor-cover stack produced by step 510.

Step 530 pre-cuts the sensor-cover wafer stack (optionally as part of the camera wafer stack) from the first side of the image sensor wafer. Step 540 deposits an opaque material in the pre-cuts.

Figures 6, 7:
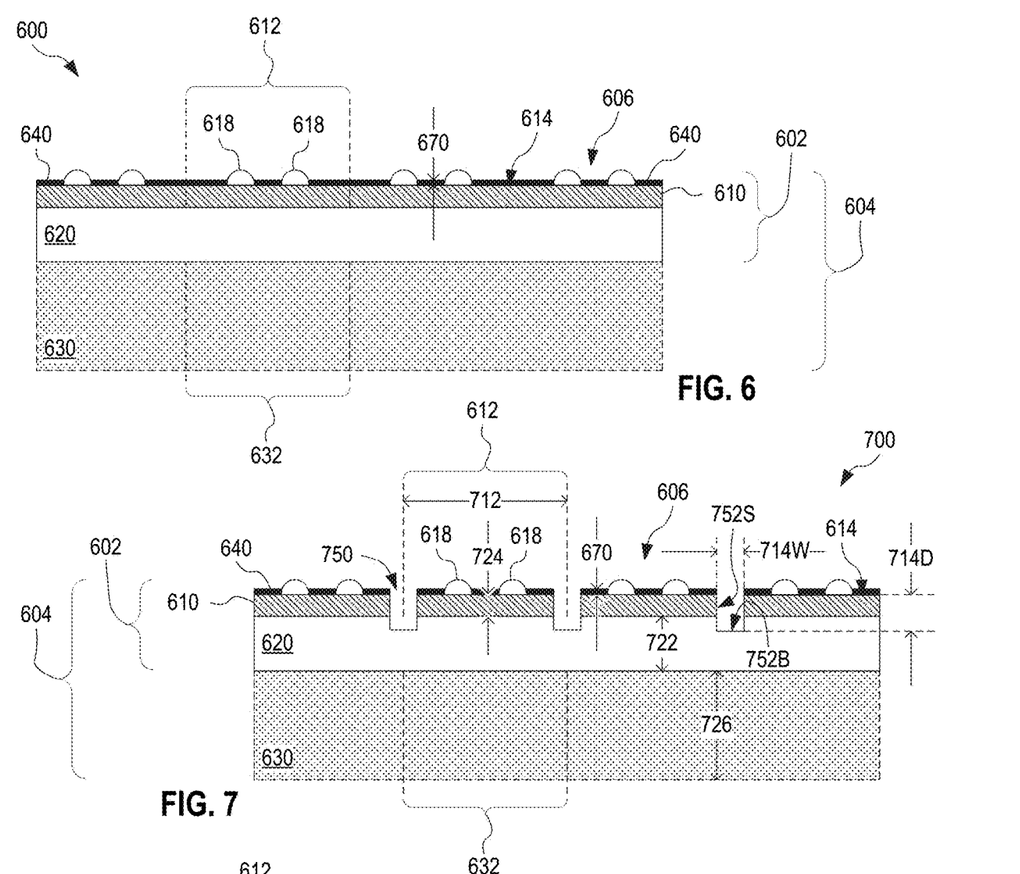
Figure 8:
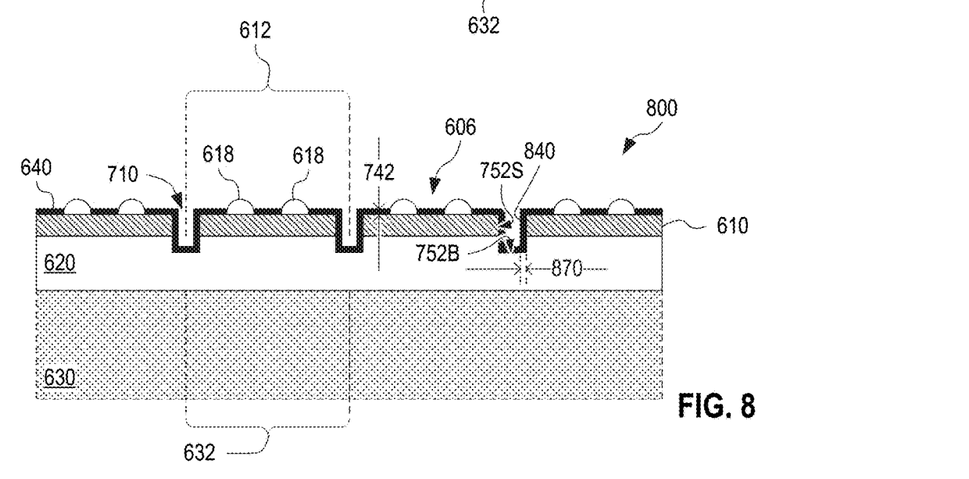

FIGS. 6-8 illustrate, in cross sectional views, an example of steps 530 and 540. FIGS. 5-8 are best viewed together in the following description. FIG. 6 shows one workpiece 600 processed by step 530. Workpiece 600 is either a sensor-cover wafer stack 602 or a camera wafer stack 604. Sensor-cover wafer stack 602 includes an image sensor wafer 610 and a cover glass 620. Camera wafer stack 604 includes sensor-cover wafer stack 602 and lens wafer 630. Image sensor wafer 610 includes a plurality of image sensors 612, each having a plurality of solder balls 618. Lens wafer 630 includes a plurality of lenses 632. In camera wafer stack 604, each lens 632 is aligned with a corresponding image sensor 612. It is understood that image sensor wafer 610 typically includes more image sensors 612 than depicted in FIGS. 6-8, and that lens wafer 630 typically includes more lenses 632 than depicted in FIGS. 6-8. Solder balls 618 are on a side 606 of image sensor wafer 610. Side 606 further includes an opaque layer 640 disposed on a surface 614 of image sensor wafer 610 facing away from cover glass 620. Opaque layer 640 is disposed on portions of surface 614 not occupied by solder balls 618. Opaque layer 640 is, for example, black solder resist. The thickness 670 of opaque layer 640 may be in the range between 8 and 22 microns. With thickness 670 in this range, black photoresist provides good light shielding.

Step 530 forms pre-cuts 750 in side 606 between image sensors 612 to form a workpiece 700 (see FIG. 7). Pre-cuts 750 may have a layout similar to that of dicing lines 460H and 460V in FIG. 4. Pre-cuts 750 are precursors to actual dicing in subsequent step 560. Each pre-cut 750 has a depth 714D and a width 714W. Depth 714D may exceed the depth of image sensor wafer 610, such that pre-cuts extend partly into cover glass 620. In one example, depth 714D is at least 50 microns, such as between 80 and 100 microns or between 70 and 120 microns, and width 714W is in the range between 150 and 200 microns. Pre-cuts 750 form side walls 752S and bottom walls 752B. Side walls 752S and bottom walls 752B are not covered by opaque layer 640.

Step 540 deposits an opaque material 840 in pre-cuts 750 to form a workpiece 800 (see FIG. 8). Opaque material 840 may be a black material, such as black epoxy or black photoresist. In one embodiment, step 540 includes a step 542 of depositing opaque material 840 on side walls 752S and 752B to form a coating thereon, as shown in FIG. 8. This coating may have thickness 870. Thickness 870 may be in the range between 8 and 22 microns, such that a black material provides good light shielding. In an alternative embodiment, opaque material 840 fills pre-cuts 750, or fills pre-cuts 750 up to a certain height while coating the full height of side walls 752S. Step 540 may include a step 544 of achieving complete opaque coverage of side 606, including pre-cuts 750.

Figure 9:
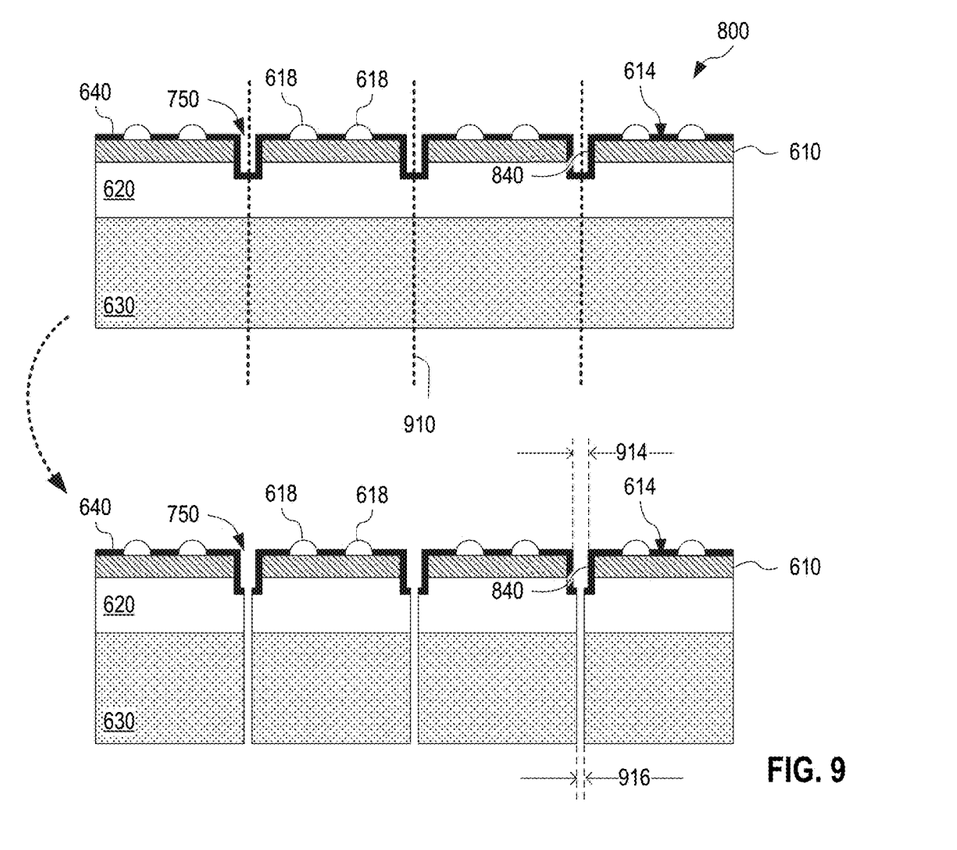
Figure 10:
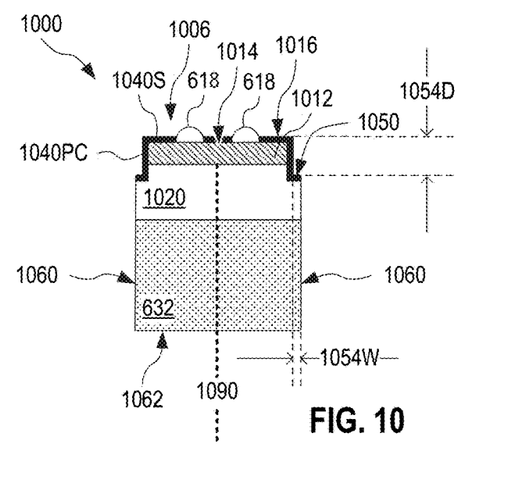

Step 560 dices the camera wafer stack to form a plurality of camera dies. Each camera die includes (a) one of the image sensors of the image sensor wafer, (b) a portion of the cover glass, and (c) one of the lenses of the lens wafer. FIGS. 9 and 10 illustrate, in cross-sectional views an example of step 560. FIGS. 5, 9, and 10 are best viewed together in the following description. In this example, step 560 dices workpiece 800 along dicing lines 910 coinciding with pre-cuts 750 (see FIG. 9). Dicing of workpiece 800 results in the singulation of partly light-shielded camera dies 1000. One camera die 1000 is depicted in FIG. 10. Camera die 1000 includes (a) an image sensor 1012 that is image sensor 612 minus substrate material lost to pre-cuts 750, (b) a cover glass 1020 that is a portion of cover glass 620, and (c) lens 632. On a backside 1006 of camera die 1000, camera die 1000 further includes an opaque layer 1040S on portions of a back surface 1014 of image sensor 612 not occupied by solder balls 618. Opaque layer 1040S is a portion of opaque layer 640. In addition, camera die 1000 includes an opaque material 1040PC. Opaque material 1040PC is a portion of opaque material 840 remaining after step 560.

In the example shown in FIG. 9, dicing width 916 is less than the width 914 of pre-cuts 750 coated with opaque material 840, such that each camera die 1000 forms a ledge 1050 that surrounds the optical axis 1090 of camera die 1000. Ledge 1050 includes a portion of opaque material 1040PC and is recessed from a surface 1016 of opaque layer 1040S by a depth 1054D. Depth 1054 may be similar to depth 714D. Ledge 1050 has width 1054W. Width 1054W is defined by the difference between dicing width 916 and width 914. Between ledge 1050 and a light-receiving surface 1062 of lens 632 of camera die 1000, camera die 1000 forms planar side walls 1060. In an alternative embodiment, dicing width 916 matches width 914, or slightly exceeds width 914, such that ledge 1050 is absent in camera die 1000.

Step 570 applies an opaque coating to second sides of at least one of the camera dies singulated in step 560, wherein the second sides are exposed in dicing step 560.

Figure 11:
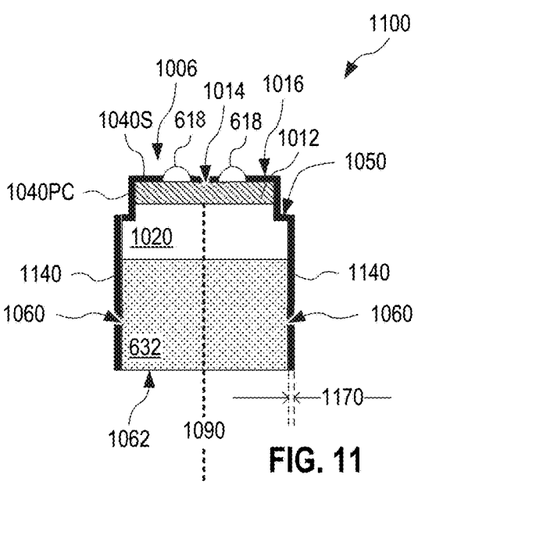

FIG. 11 is a cross-sectional view of one example of step 570. In this example, an opaque coating 1140, such as black paint or black epoxy, is applied to planar side walls 1060 of one or more partly light-shielded camera dies 1000 to form a light-shielded camera 1100. The thickness 1170 of opaque coating 1140 may be similar to thickness 670 of opaque layer 640.

Referring now to FIGS. 5 and 7, step 530 may be performed on the sensor-cover wafer stack, prior to bonding the lens wafer thereto, when the sensor-cover wafer stack in itself has sufficient thickness to undergo pre-cutting in step 530 without significant risk of breakage. For example, when the thickness 722 of cover glass 620 is at least 400 microns, step 530 may be performed on sensor-cover wafer stack 602 prior to bonding lens wafer 630 thereto. Image sensor wafer 610 may be based on a silicon substrate of thickness 724 in the range between 50 and 100 microns. On the other hand, when thickness 722 is less than 400 microns, step 530 may benefit from being performed on camera wafer stack 604 to take advantage of the structural support provided by lens wafer 630. Lens wafer 630 may have thickness 726 in the range between 500 microns and 10 millimeters. Thus, in one embodiment, suitable for implementation when the cover glass is at least 400 microns thick, step 520 is performed after step 530, for example between steps 540 and 560 as indicated by the dotted arrow in FIG. 5. In another embodiment, which may be advantageous when the cover glass is less than 400 microns thick, step 520 may be performed before step 530, or method 500 may receive as its input a camera wafer stack provided by a third party and already including the lens wafer.

In one embodiment, solder balls are formed on the image sensor wafer prior to performing method 500, for example as shown in FIG. 6. In another embodiment, method 500 includes a step 550 of implanting solder balls on the image sensor wafer. Step 550 is, for example, performed after step 540 but before step 560 such that solder ball implantation is performed at the wafer level. In embodiments where solder balls are implanted in step 550 between steps 540 and 560, the opaque layer on the first side of the image sensor wafer (e.g., opaque layer 640) may cover the entire first side of the image sensor wafer. In this case, step 550 includes removing portions of the opaque layer, for example by etching, in the locations where the solder balls are to be implanted. Alternatively, the opaque layer is pre-patterned and forms openings where solder balls are to be implanted in step 550. In embodiments of method 500 where step 520 is performed between steps 540 and 560, step 550 may be performed after step 540 and before step 520, or after step 520 and before step 560. In such embodiments, a simpler workflow may be achieved when performing step 550 after step 540 and before step 520.

In certain embodiments, method 500 includes step 520 and a step 512 prior to step 520, and step 530 includes a step 532. Step 512 scribes the first side of the image sensor wafer. The scribe lines are between the different rows and columns of image sensors of the image sensor wafer, such that step 530 implements step 532 of forming at least some of the pre-cuts (e.g., pre-cuts 750) on the scribe lines. The scribe lines may be wider than the pre-cuts. In one example the scribe lines are between 10 and 50 microns wider than the pre-cuts. The scribe lines may aid alignment of the lens wafer to the image sensor wafer, such that lenses of the lens wafer are properly registered to image sensors of the image sensor wafer. In such embodiments, step 520 may include a step 522 of aligning the lens wafer to the image sensor wafer aided by the scribe lines.

Figure 12:
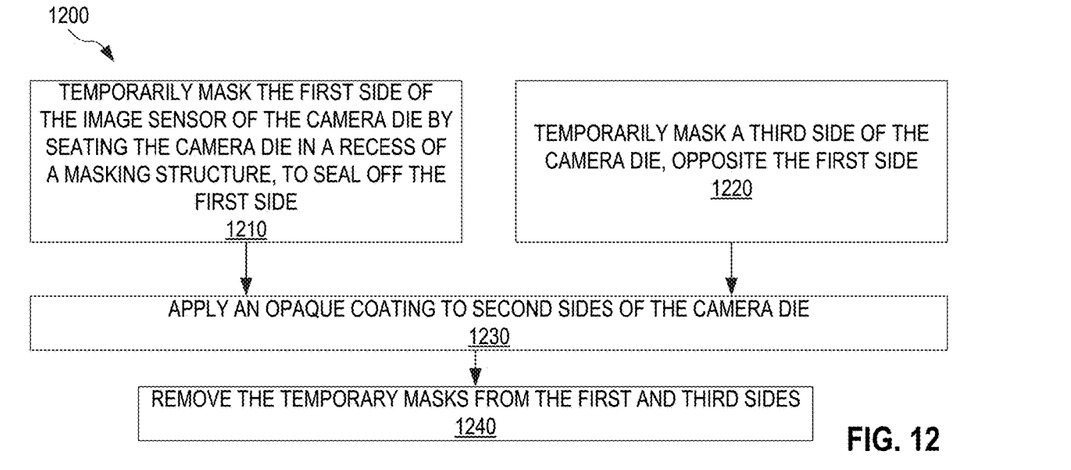
FIG. 12 is a flowchart for a method for light-shielding side walls of a camera die, according to an embodiment.

FIG. 12 is a flowchart for one method 1200 for light-shielding side walls of a camera die. Method 1200 is an embodiment of step 570 of method 500 and may be used to light shield planar side walls 1060 of partly light-shielded camera die 1000 to form light-shielded camera 1100. Method 1200 includes steps 1210, 1220, 1230, and 1240. FIGS. 13-16 illustrate an example of method 1200 applied to partly light-shielded camera die 1000. FIGS. 12-16 are best viewed together in the following description.

Step 1210 temporarily masks a first side of the image sensor of the camera die by seating the camera die in a recess of a mask. Step 1210 thereby seals off the first side of the image sensor, for example to prevent deposition of light-shielding material on electrical connections such as solder balls. Step 1220 temporarily masks a third side of the camera die, opposite the first side. The third side is the side through which the camera die receives light from a scene, and step 1220 prevents deposition of light-shielding material that might otherwise obscure light collection by the lens of the camera die.

Figure 13:
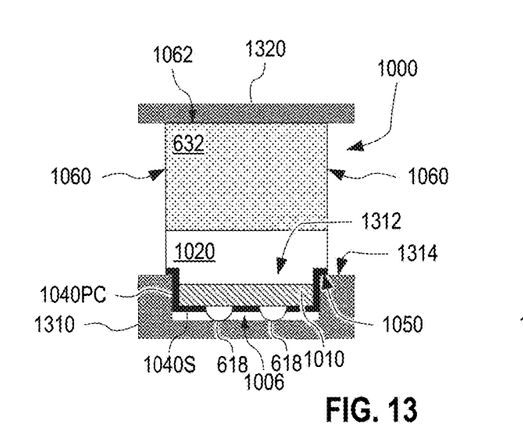
Figure 14:
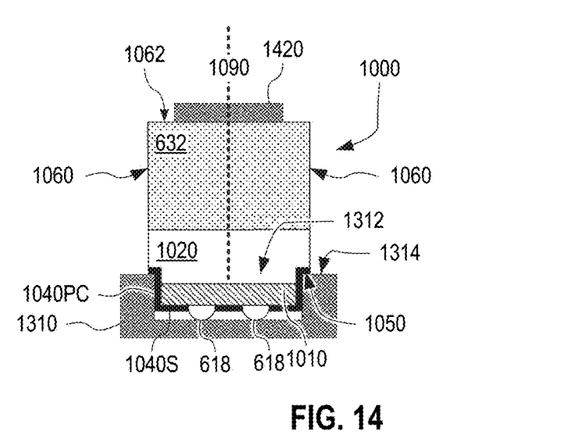

In one example of steps 1210 and 1220, illustrated in FIG. 13, camera die 1000 is seated in a recess 1312 of a mask 1310 such that ledge 1050 rests on a surface 1314 of mask 1310, and a mask 1320 is placed on light receiving surface 1062 of camera die 1000. The contact interface between ledge 1050 and surface 1314 may surround optical axis 1090. Mask 1320 fully covers light-receiving surface 1062. In an alternative example, illustrated in FIG. 14, mask 1320 is replaced by a mask 1420 that covers only a central portion of light-receiving surface 1062. Mask 1420 may be centered on optical axis 1090 to mask a desired aperture for light-collection into lens 632. Each of mask 1320 and 1420 may be a thermal tape.

In certain scenarios, ledge 1050 may be spaced apart from surface 1314 by a small distance. In one such scenario, opaque material 1040PC may be sealed against side walls of recess 1312 so ensure that mask 1310 seals off backside 1006. In another such scenario, ledge 1050 is not perfectly sealed to surface 1314 and opaque material 1040PC is not perfectly sealed to side walls of recess 1312 but the path from outside mask 1310 to backside 1006 is nevertheless sufficiently arduous to sufficiently seal off backside 1006.

Figure 15:
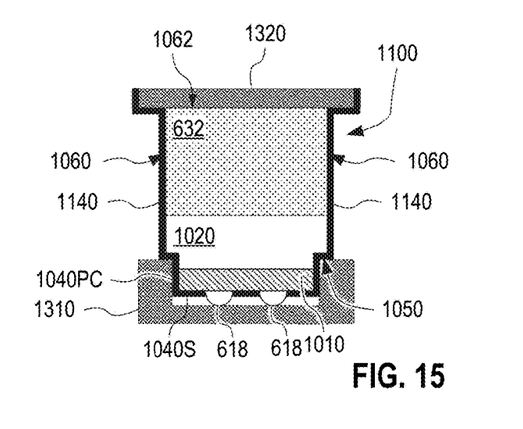
Figure 16:
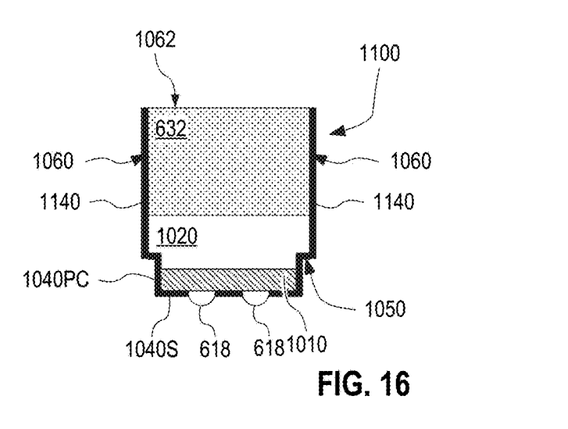

Step 1230 applies an opaque coating to second sides of the camera die exposed by dicing in step 560 of method 500. In one example of step 1230, illustrated in FIG. 15 and related to the example of FIG. 13, an opaque coating is applied to planar side walls 1060 to produce light-shielded camera 1100. Planar side walls 1060 are not masked by either one of masks 1310 and 1320. (Planar side walls 1060 are also not masked by mask 1420.) Step 1230 may cause deposition of the opaque coating on one or both of the masks, for example on mask 1320 as shown in FIG. 15. Step 1230 may utilize a spraying technique to spray black paint or black epoxy onto the second sides (as well as onto one or both of the masks).

Step 1240 removes the temporary masks from the first and third sides of the light-shielded camera. In one example of step 1240, illustrated in FIG. 16, masks 1310 and 1320 (or 1420) are removed from light-shielded camera 1100.

Method 1200 highlights an advantage of forming pre-cuts and light-shielding the pre-cuts, in steps 530 and 540 of method 500, prior to dicing the camera wafer stack (e.g., camera wafer stack 604). As illustrated in FIG. 13, the existence of already light-shielded pre-cuts enables positioning of camera die 1000 in recess 1312 of mask 1310 to fully seal off the entire backside 1006 of camera die 1000, while still leaving all unshielded side walls accessible for light shielding (as shown in FIG. 15).

Figure 17:
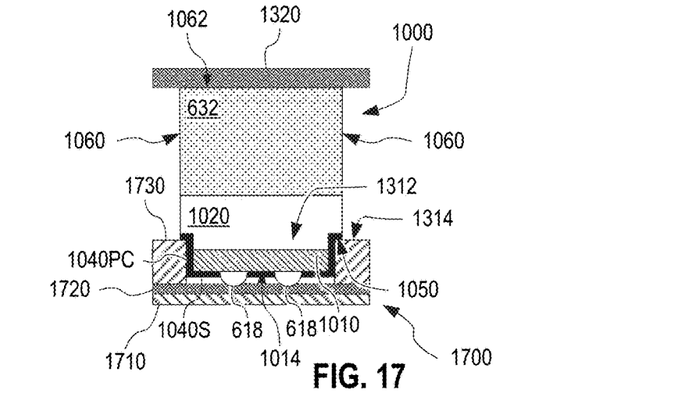
FIG. 17 illustrates a mask that may be used with the method of FIG. 12, according to an embodiment.

FIG. 17 illustrates one mask 1700 that may be used in step 1210 of method 1200. Mask 1700 is an embodiment of mask 1310. Mask 1700 includes a substrate 1710 (a silicon wafer, for example), a double-sided adhesive 1720, and a patterned film 1730 forming recess 1312. Substrate 1710 may be a silicon wafer, and patterned film 1730 may be a polyethylene terephthalate film. Double-sided adhesive 1720 is sandwiched between substrate 1710 and patterned film 1730. When seating camera die 1000 in mask 1700, solder balls 618 may temporarily adhere to double-sided adhesive 1720, to help secure camera die 1000 in mask 1700. Double-sided adhesive 1720 may be compressible, such that solder balls 618 may be pressed into double-sided adhesive 1720.

Figure 18:
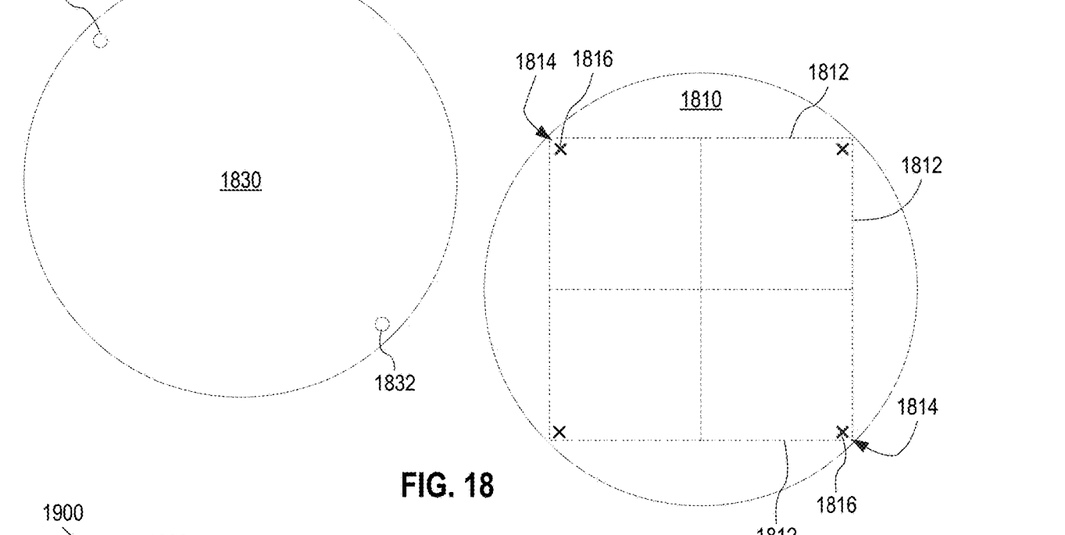
FIG. 18 illustrates a scribe-line aided method for aligning a lens wafer to an image sensor wafer, according to an embodiment.

FIG. 18 illustrates one scribe-line aided method 1800 for aligning a lens wafer 1830 to an image sensor wafer 1810. Method 1800 may be implemented in step 522 of method 500. Image sensor wafer 1810 forms scribe lines 1812, such as the scribe lines applied in step 512 of method 500. Without departing from the scope hereof, image sensor wafer 1810 may form more or fewer scribe lines than depicted in FIG. 18, and/or scribe lines 1812 may be positioned differently from what is shown in FIG. 18. Lens wafer 1830 includes one or more marks 1832, for example diagonally opposite from each other as depicted in FIG. 18. In one embodiment, when bonding lens wafer 1830 to the sensor-cover wafer stack in step 520, marks 1832 are registered to scribe lines 1812 in a predefined manner so ensure proper registration of lenses of lens wafer 1830 to image sensors of image sensor wafer 1810. For example, marks 1832 may be oriented to be positioned on the diagonal between scribe line corners 1814. In another embodiment, image sensor wafer 1810 include marks 1816 formed on image sensor wafer 1810 as guided by scribe lines 1812, and marks 1832 are positioned above marks 1816 when bonding lens wafer 1830 to the sensor-cover wafer stack in step 520.

Figure 19:
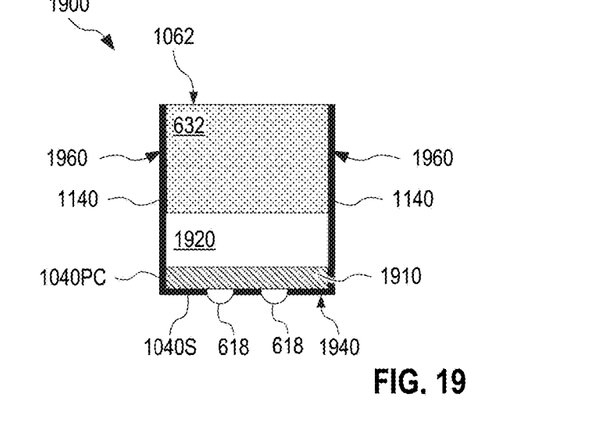
FIG. 19 illustrates another light-shielded camera having entirely planar side walls, according to an embodiment.

FIG. 19 illustrates another light-shielded camera 1900 having entirely planar side walls 1960. Camera 1900 is similar to camera 1100 except that camera 1900 has planar side walls extending all the way from light-receiving surface 1062 to a back surface 1940 of opaque layer 1040S. Camera 1900 may be formed by an embodiment of method 500, wherein (a) dicing width 916 is the same as width 914 of pre-cuts 750 coated by opaque material 840 (see FIG. 9) or (b) dicing width 916 is in the range between width 914 and width 714W of pre-cuts 750 (see FIG. 7). Each planar side wall 1960 includes opaque material 1040PC and opaque coating 1140. However, ledge 1050 does not exist.

Combinations of Features

Features described above as well as those claimed below may be combined in various ways without departing from the scope hereof. For example, it will be appreciated that aspects of one light-shielded camera, or method of manufacture, described herein, may incorporate features or swap features of another light-shielded camera, or method of manufacture, described herein. The following examples illustrate some possible, non-limiting combinations of embodiments described above. It should be clear that many other changes and modifications may be made to the methods, products, and systems herein without departing from the spirit and scope of this invention:

(A1) One method for manufacturing light-shielded cameras includes forming a plurality of camera dies by dicing a camera wafer stack including (a) an image sensor wafer having a plurality of image sensors, (b) a cover glass bonded to the image sensor wafer, and (c) a lens wafer bonded to the cover glass and having a plurality of lenses. Each camera die includes one of the image sensors, a portion of the cover glass, and one of the lenses. The method further includes, prior to the step of dicing, (i) from a first side of the image sensor wafer facing away from the cover glass and at least partly covered by an opaque layer, pre-cutting a sensor-cover wafer stack that includes the image sensor wafer and the cover glass, to form pre-cuts for said dicing, and (ii) depositing an opaque material in the pre-cuts. In addition, the method includes, after the step of dicing, applying an opaque coating to second-side surfaces of the camera dies, wherein the second-side surfaces are formed by said dicing.

(A2) In the method denoted as (A1), the step of depositing may include depositing the opaque material on surfaces exposed by the pre-cuts without filling the pre-cuts.

(A3) Either of the methods denoted as (A1) and (A2) may further include bonding the lens wafer to the cover glass to form the wafer stack.

(A4) In the method denoted as (A3), the cover glass may have thickness no greater than 400 microns and the method may further include performing the step of bonding prior to the step of pre-cutting.

(A5) In either of the methods denoted as (A3) and (A4), the pre-cuts may have depth of at least 50 microns.

(A6) Any of the methods denoted as (A3) through (A5) may further include implanting solder balls on the image sensors between the steps of depositing and dicing.

(A7) In the method denoted as (A3), thickness of the cover glass may be at least 400 microns, and the method may further include performing the step of bonding after the step of pre-cutting.

(A8) The method denoted as (A7) may further include implanting solder balls on the image sensors between the steps of depositing and bonding.

(A9) In any of the methods denoted as (A1) through (A8), the step of applying may include, for each of the at least one camera dies, (I) temporarily masking the first side by seating the camera die in in a recess of a mask, to seal off the first side of the image sensor of the camera die, (II) temporarily masking a third side of the camera die, opposite the first side, and (III) while the third side and the first side are temporarily masked, applying the opaque coating.

(A10) In the method denoted as (A9), the mask may include a substrate, a double-sided adhesive adhered to the substrate, and a top layer disposed on the double-sided adhesive opposite the substrate, wherein the top layer forms an aperture that cooperates with an uncovered portion of the double-sided adhesive to form the recess.

(A11) In either of the methods denoted as (A9) and (A10), the step of dicing may be characterized by a dicing width that is less than the width of the pre-cuts after deposition of the opaque layer therein, such that each camera die forms a ledge that faces in same direction as the first side and surrounds an optical axis of the camera die, and the step of temporarily masking the first side may include seating the camera die in in the recess such that the ledge is outside the recess.

(A12) In the method denoted as (A11), the step of temporarily masking the first side may include seating the camera die in in the recess such that the ledge is in contact with the mask, wherein a contact interface between the ledge and the mask surrounds the recess.

(A13) In any of the methods denoted as (A1) through (A12), the opaque layer may be a black solder mask material.

(A14) In any of the methods denoted as (A1) through (A13), the pre-cuts may have depth in range between 70 and 120 microns.

(A15) Any of the methods denoted as (A1) through (A14) may further include scribing the first side before the step of pre-cutting to form scribe lines, and, in the step of pre-cutting, forming at least some of the pre-cuts on the scribe lines.

(A16) In any of the methods denoted as (A1) through (A15), the lens wafer may include a plurality of sub-wafers each including a plurality of lens elements, such that each of the lenses includes a lens element from each of the sub-wafers.

(B1) One light-shielded camera includes (a) an image sensor having opposite-facing first and second sides, the first side including a plurality of solder balls and opaque material disposed on portions of the first side not occupied by the solder balls, (b) a cover glass bonded to the second side, and (c) a lens bonded to the cover glass, wherein the light-shielded camera forms four sidewalls parallel to an optical axis of the light-shielded camera, and each of the four sidewalls is coated by an opaque coating and includes a planar portion cooperatively formed by the image sensor, the cover glass, and the lens.

(B2) In the light-shielded camera denoted as (B1), the opaque material and the solder balls may cooperate to fully cover the first side.

(B3) In either of the light-shielded cameras denoted as (B1) and (B2), the lens may include a light-receiving side facing away from the image sensor, and the opaque material, the opaque coating, and the solder balls may cooperate to cover all sides of the of light-shielded camera except for (a) the light-receiving side of the lens or (b) an aperture on the light-receiving side of the lens.

(B4) In any of the light-shielded cameras denoted as (B1) through (B3), each of the planar portions may terminate on a ledge that faces in same direction as the first side and surrounds an optical axis of the camera die.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present systems and methods, which, as a matter of language, might be said to fall therebetween.

What is claimed is:

1. A method for manufacturing light-shielded cameras, comprising:

forming a plurality of camera dies by dicing a camera wafer stack including (a) an image sensor wafer having a plurality of image sensors, (b) a cover glass bonded to the image sensor wafer, and (c) a lens wafer bonded to the cover glass and having a plurality of lenses, each camera die including one of the image sensors, a portion of the cover glass, and one of the lenses;

prior to said dicing:
        from a first side of the image sensor wafer facing away from the cover glass and at least partly covered by an opaque layer, pre-cutting a sensor-cover wafer stack that includes the image sensor wafer and the cover glass, to form pre-cuts for said dicing, and
        depositing an opaque material in the pre-cuts; and after said dicing, applying an opaque coating to second-side surfaces of the camera dies, the second-side surfaces being formed by said dicing.

2. The method of claim 1, the step of depositing comprising depositing the opaque material on surfaces exposed by the pre-cuts without filling the pre-cuts.

3. The method of claim 1, further comprising bonding the lens wafer to the cover glass to form the wafer stack.

4. The method of claim 3, further comprising performing the step of bonding prior to the step of pre-cutting, the cover glass having thickness no greater than 400 microns.

5. The method of claim 4, the pre-cuts having depth of at least 50 microns.

6. The method of claim 4, further comprising implanting solder balls on the image sensors between the steps of depositing and dicing.

7. The method of claim 3, further comprising performing the step of bonding after the step of pre-cutting, thickness of the cover glass being at least 400 microns.

8. The method of claim 7, further comprising implanting solder balls on the image sensors between the steps of depositing and bonding.

9. The method of claim 1, the step of applying comprising, for each of the at least one camera dies:

temporarily masking the first side by seating the camera die in in a recess of a mask, to seal off the first side of the image sensor of the camera die;
    temporarily masking a third side of the camera die, opposite the first side; and
    while the third side and the first side are temporarily masked, applying the opaque coating.

10. The method of claim 9, the mask including a substrate, a double-sided adhesive adhered to the substrate, and a top layer disposed on the double-sided adhesive opposite the substrate, the top layer forming an aperture that cooperates with an uncovered portion of the double-sided adhesive to form the recess.

11. The method of claim 9, the step of dicing being characterized by a dicing width that is less than width of the pre-cuts after deposition of the opaque layer therein, such that each camera die forms a ledge that faces in same direction as the first side and surrounds an optical axis of the camera die, the step of temporarily masking the first side comprising seating the camera die in in the recess such that the ledge is outside the recess.

12. The method of claim 11, the step of temporarily masking the first side comprising seating the camera die in in the recess such that the ledge is in contact with the mask, a contact interface between the ledge and the mask surrounding the recess.

13. The method of claim 1, the opaque layer being a black solder mask material.

14. The method of claim 1, the pre-cuts having depth in range between 70 and 120 microns.

15. The method of claim 1, further comprising:
scribing the first side before the step of pre-cutting to form scribe lines; and
in the step of pre-cutting, forming at least some of the pre-cuts on the scribe lines.

16. The method of claim 1, the lens wafer including a plurality of sub-wafers each including a plurality of lens elements such that each of the lenses includes a lens element from each of the sub-wafers.

17. A light-shielded camera formed from a camera wafer stack comprising an image sensor wafer, a cover glass and a lens wafer, the camera comprising:
an image sensor having opposite-facing first and second sides, the first side including a plurality of solder balls;
a cover glass bonded to the second side;
an opaque material deposited on portions of the first side not occupied by the solder balls and in pre-cuts formed in at least the image sensor wafer from the first side; a lens bonded to the cover glass; and
an opaque coating applied to four sidewalls of the light-shielded camera oriented parallel to an optical axis of the light-shielded camera and formed by a dicing process of the camera wafer stack wherein the light-shielded camera further comprises a planar portion between the four sidewalls and the pre-cuts, the planar portion coated by the opaque material.

18. The light-shielded camera of claim 17, the opaque material and the solder balls cooperating to fully cover the first side.

19. The light-shielded camera of claim 17,
the lens including a light-receiving side facing away from the image sensor; and
the opaque material, the opaque coating, and the solder balls cooperating to cover all sides of the light-shielded camera except for (a) the light-receiving side of the lens or (b) an aperture on the light-receiving side of the lens.

20. The light-shielded camera of claim 17, each of the planar portions terminating on a ledge that faces in same direction as the first side and surrounds an optical axis of the camera die.

* * * * *